US009795069B2

(12) United States Patent
Waffenschmidt (10) Patent No.: US 9,795,069 B2
(45) Date of Patent: Oct. 17, 2017

(54) METHOD FOR CONFIGURING AN ELECTRONIC DEVICE HAVING AN INDUCTIVE RECEIVER COIL WITH ULTRA-THIN SHIELDING LAYER

(71) Applicant: KONINKLIJKE PHILIPS N.V., Eindhoven (NL)

(72) Inventor: Eberhard Waffenschmidt, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 197 days.

(21) Appl. No.: 14/632,363

(22) Filed: Feb. 26, 2015

(65) Prior Publication Data
US 2015/0170829 A1 Jun. 18, 2015

Related U.S. Application Data

(62) Division of application No. 13/319,841, filed as application No. PCT/IB2010/051979 on May 5, 2010, now Pat. No. 9,084,343.
(Continued)

(51) Int. Cl.
*H01F 7/06* (2006.01)
*H05K 9/00* (2006.01)
(Continued)

(52) U.S. Cl.
CPC ......... *H05K 9/0075* (2013.01); *H01F 27/365* (2013.01); *H02J 5/005* (2013.01);
(Continued)

(58) Field of Classification Search
CPC .. H01F 27/365; H01F 38/14; H01F 2027/348; H02J 5/005; H02J 7/025; H05K 9/0075
(Continued)

(56) References Cited

U.S. PATENT DOCUMENTS 4,980,641 A 12/1990 Breneman et al.
5,760,335 A 6/1998 Gilboa
(Continued)

FOREIGN PATENT DOCUMENTS

EP 1928003 A2 4/2008
EP 2015424 A2 1/2009
(Continued)

OTHER PUBLICATIONS

Waffenschmidt E. et al., "Integrated Ultra Thin Flexible Inductors for Low Power Converters", Power Electronics Specialists Conference, 2005. PESC '05, IEEE 36th, Jun. 16, 2005, pp. 1528-1534.

*Primary Examiner* — Paul D Kim (57) ABSTRACT

An electronic device which is inductively powered or charged has a receiver coil on which a metal object can be placed without causing deterioration of the coil's magnetic field and without generating heat in the metal object. An ultra-thin, flexible, high magnetic permeability metal foil having a thickness of 50 μm or less is provided as a shielding layer between the coil and the object. Radial slits are provided in the shielding layer, which suppress unwanted eddy currents in the layer to reduce power transfer losses and heat generation.

3 Claims, 6 Drawing Sheets

Related U.S. Application Data (60) Provisional application No. 61/179,758, filed on May 20, 2009.

(51) Int. Cl.
*H01F 27/36* (2006.01)
*H02J 5/00* (2016.01)
*H02J 7/02* (2016.01)
*H01F 38/14* (2006.01)
*H01F 27/34* (2006.01)

(52) U.S. Cl.
CPC ............. *H02J 7/025* (2013.01); *H01F 38/14* (2013.01); *H01F 2027/348* (2013.01)

(58) Field of Classification Search
USPC .... 29/602.1, 604, 606, 607; 336/84 C, 84 R, 336/84 M, 73, 77, 133; 361/800, 816
See application file for complete search history.

(56) References Cited

U.S. PATENT DOCUMENTS

| | | | |
|---|---|---|---|
| 6,018,298 A | 1/2000 | Endo | |
| 6,149,760 A | 11/2000 | Hama | |
| 6,489,745 B1 | 12/2002 | Koreis | |
| 6,531,030 B1 | 3/2003 | Nakajima | |
| 7,175,339 B2 | 2/2007 | Bisig | |
| 7,248,017 B2 | 7/2007 | Cheng | |
| 7,948,208 B2 * | 5/2011 | Partovi | H02J 7/0027 320/108 |
| 7,952,322 B2 * | 5/2011 | Partovi | H01F 5/003 320/108 |
| 8,188,826 B2 | 5/2012 | Okada | |
| 8,203,328 B2 | 6/2012 | Bose | |
| 8,269,595 B2 | 9/2012 | Okada | |
| 8,427,102 B2 * | 4/2013 | Hanley | H02J 7/025 320/108 |
| 8,482,250 B2 * | 7/2013 | Soar | H01F 38/14 320/104 |
| 8,610,312 B2 * | 12/2013 | Kikuchi | H01Q 1/248 307/104 |
| 8,766,487 B2 * | 7/2014 | Dibben | H02J 5/005 307/104 |
| 8,853,891 B2 * | 10/2014 | Soar | F41H 1/02 307/104 |
| 8,872,386 B2 * | 10/2014 | Mach | H02J 5/00 307/104 |
| 2001/0045616 A1 | 11/2001 | Yoshitomi | |
| 2002/0158306 A1 | 10/2002 | Nitsu | |
| 2003/0141801 A1 | 7/2003 | Piejak | |
| 2005/0085122 A1 | 4/2005 | Chiou | |
| 2008/0019083 A1 | 1/2008 | Lim | |
| 2008/0164840 A1 | 7/2008 | Kato et al. | |
| 2010/0156344 A1 | 6/2010 | Inque | |
| 2010/0328044 A1 | 12/2010 | Waffenschmidt et al. | |

FOREIGN PATENT DOCUMENTS

| | | |
|---|---|---|
| JP | 11251303 A | 9/1999 |
| JP | 2000090221 A | 3/2000 |
| JP | 2006042519 | 9/2006 |
| JP | 2008172872 A | 7/2008 |
| JP | 20080172099 A | 7/2008 |
| JP | 2009021495 A | 1/2009 |
| KR | 2010082280 A | 7/2010 |
| WO | 2005020254 A2 | 3/2005 |
| WO | WO2005020253 A2 | 3/2005 |
| WO | 2007080820 A1 | 7/2007 |
| WO | WO2007090168 A2 | 8/2007 |
| WO | 2008050260 A1 | 5/2008 |
| WO | 2008099803 A1 | 8/2008 |

\* cited by examiner

METHOD FOR CONFIGURING AN ELECTRONIC DEVICE HAVING AN INDUCTIVE RECEIVER COIL WITH ULTRA-THIN SHIELDING LAYER

This is a division of application Ser. No. 13/319,841 filed Nov. 10, 2011, now U.S. Pat. No. 9,084,343

The present embodiments relate generally to electronic devices and more particularly, to electronic devices having an inductive receiver coil with an ultra-thin shielding layer and method.

Mobile devices include consumer electronics and medical equipment. Several examples of mobile consumer electronic devices include, but are not limited to, mobile phones, portable music players, and digital cameras. An example of medical equipment includes, but is not limited to, portable sensors. In general, mobile devices contain some form of power source which periodically needs to be recharged in order for the mobile device to remain functional for its intended purpose, wherein the power source can be inductively charged via a receiver coil. The power source may also include an inductive power source for generating power to operate the mobile device. For inductively powered or charged mobile devices, the mobile device is placed within an inductive coupling region of a transmitter coil, wherein responsive to an alternating magnetic field produced by the transmitter coil, energy from the alternating magnetic field is received by the receiver coil.

One problem with the use of a receiver coil for inductively charging a power source, such as a battery, is that a battery generally comprises a metal object. However, placement of the metal object on top of the receiver coil is detrimental. That is, the presence of the metal object on top of the receiver coil undesirably deteriorates an inductive power transfer to the receiver coil due to induced eddy currents in the metal object that disadvantageously reduce the magnetic field received in the receiver coil. In addition, the induced eddy currents in the metal object can generate excessive and/or undesirable heat in the metal object, which raises safety concerns with respect to the mobile device usage. Another alternative might be to place the metal object beside the receiver coil; however, such a solution undesirably consumes a larger area of a corresponding device or undesirably increases a size of the device layout.

One known approach to address the above problem has been to add a softmagnetic ferrite layer between the receiver coil and the metal object. However, such a softmagnetic ferrite layer is rather thick. Solid ferrite material is brittle and requires a thickness on the order of at least one millimeter (1 mm) or more for mechanical stability. An example of a less brittle softmagnetic ferrite layer includes Ferrite Polymer Compound (FPC). FPC however has a low magnetic permeability. To achieve a reasonable shielding function, the FPC material has to be at least 1 mm thick. Such a large thickness is disadvantageous for use in mobile device applications requiring reduced dimensions, wherein the distance between the receiver coil and the metal object should be as thin as possible to save space in the mobile device.

Accordingly, an improved system and method for overcoming the problems in the art is desired.

In the figures, like reference numerals refer to like elements. In addition, it is to be noted that the figures may not be drawn to scale.

According to one embodiment of the present disclosure, an inductively powered or charged mobile device includes a receiver coil, a metal object (e.g., rechargeable battery, or the like), and an ultra-thin softmagnetic metal foil disposed in between the receiver coil and the metal object, wherein the ultra-thin softmagnetic metal foil advantageously provides a magnetic shielding layer. In one embodiment, the ultra-thin softmagnetic metal foil comprises Mumetal having a thickness on the order of fifty micrometers or less (i.e., thickness≤50 μm). Advantageously, the ultra-thin softmagnetic metal foil is more than an order of magnitude thinner than the softmagnetic ferrite layers of prior known solutions (i.e., thickness≥1 mm) In addition, the ultra-thin softmagnetic metal foil comprises electrically conducting material. To dissipate formation of any undesirable eddy currents in the shielding layer, the shielding layer is further provided with eddy current dissipation features. In one embodiment, the receiver coil comprises a circular shaped coil and the shielding layer comprises a shape sufficient to cover the receiver coil on a single side of the receiver coil, wherein the eddy current dissipation features of the shielding layer comprise radial slits formed within the shielding layer. In one embodiment, the radial slits emanate in a radial direction from a location centred on the circular shaped receiver coil.

Figure 1:
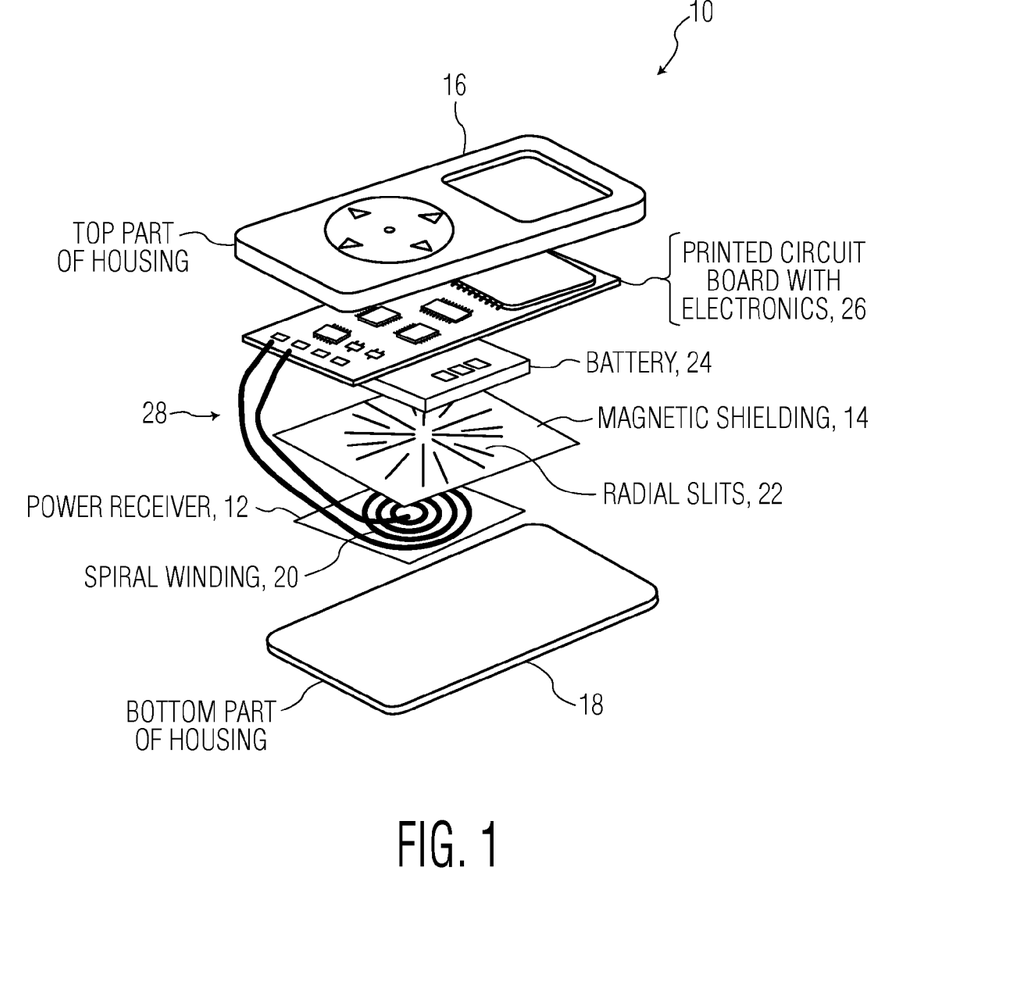
FIG. 1 is an exploded diagram view of an electronic device having an inductive receiver coil with ultra-thin shielding layer according to an embodiment of the present disclosure.

FIG. 1 is an exploded diagram view of an electronic device 10 having an inductive receiver coil 12 with ultra-thin shielding layer 14 according to an embodiment of the present disclosure. Electronic device 10 can comprise, for example, a portable music player. In particular, the mobile device 10 comprises a housing that includes a top portion 16 and a bottom portion 18, both of which are made of non-conducting material. Proximate the bottom of device 10, a spiral inductor coil 20 is concentrically located as an inductive power receiver. Located on top of the spiral coil 20, a softmagnetic layer 14 provides magnetic shielding. The magnetic shielding layer 14 includes a prescribed number of eddy current dissipation features 22, for example, radial slits provided in the shielding layer, according to the various embodiments as discussed further herein. A conducting element 24, for example, a battery or rechargeable power source, is placed on top of the shielding layer 14. In one embodiment, while not specifically illustrated, an electrically insulating layer or surface is provided between the conducting element 24 and the shielding layer 14 to prevent electrical shorting of the same when assembled in contact with one another.

The mobile device 10 further includes a printed circuit board 26 that contains, in addition to the functional circuits of the mobile device, additional electronics for a power receiver, for example, rectifier diodes, resonant and smoothing capacitors and optionally a voltage or a charge control circuit. The printed circuit board 26 is coupled to the receiver coil via suitable conductive elements, generally designated by reference numeral 28. The battery 24 in the mobile device 10 is charged by inductive power received at the receiver coil 12, for example, in response to the mobile device being placed upon a transmitter coil (not shown) configured for producing an alternating magnetic field.

Figure 2:
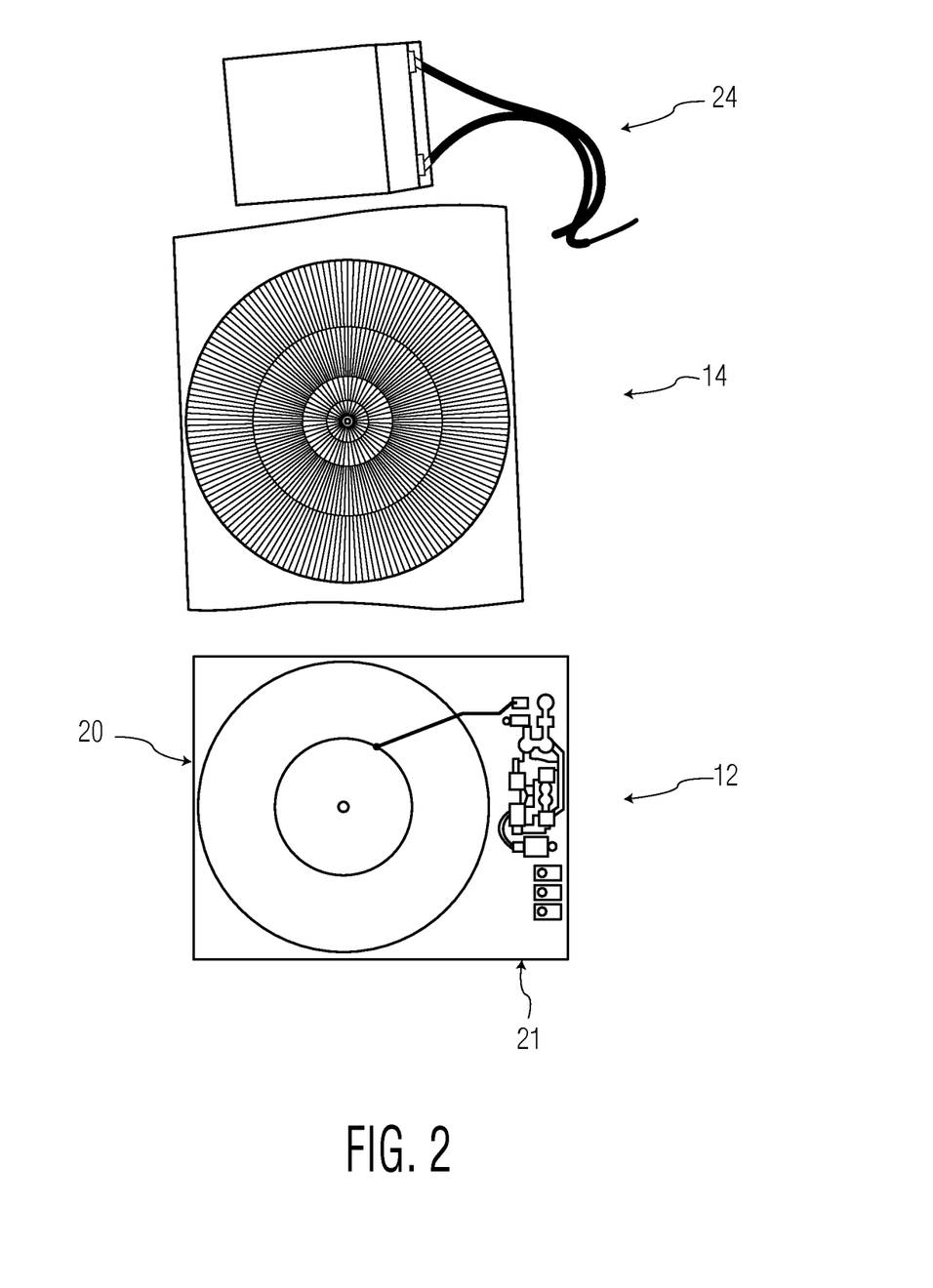
FIG. 2 is a top-down view of several components of the electronic device having an inductive receiver coil with ultra-thin shielding layer according to an embodiment of the present disclosure.

FIG. 2 is a top-down view of several components of the electronic device 10 having an inductive receiver coil with ultra-thin shielding layer according to an embodiment of the present disclosure. In particular, FIG. 2 illustrates one example of a receiver coil 12 with its associated spiral conductor 20, a shielding layer 14 with eddy current dissipation features 22, and a conducting element 24. In the embodiment of FIG. 2, the receiver coil 12 further includes additional electronics for the power receiver located to one side of the receiver coil, for example, rectifier diodes, resonant and smoothing capacitors and optionally a voltage or a charge control circuit, generally indicated by reference numeral 21. The additional electronics can be in addition to or in place of the electronics of circuit board 26 of FIG. 1. The specifications of the spiral coil 20 are selected according to the particular requirements of the electronic device 10, for example, a given battery load, charging parameters, etc. Shielding layer 14 is generally larger in dimension with respect to its layout than a corresponding layout dimension of the spiral coil 20 of the power receiver 12. In addition, the thickness dimension of shielding layer 14 is similar in thickness and/or thinner than the thickness of the spiral coil 22 of power receiver 12, as will be discussed further herein.

With reference still to FIG. 2, coil 12 is characterized by various parameters as listed in Table 1, presented herein below. The winding 20 of the receiver coil 12 can be formed as a copper etched printed circuit board coil on a flexible substrate (e.g., polyimide, "Flexfoil"). In the middle of FIG. 2, the shielding layer 14 comprising a shielding foil is shown. The shielding foil comprises a 50 μm thin foil of an amorphous iron type with properties similar to Mumetal. For example, the shielding layer material can comprise VitroVac by Vakuumschmelze in Hanau, Germany. In addition, the shielding layer 14 of FIG. 2 includes 360 slits formed by laser cutting (as discussed further herein below). At the top of FIG. 2, the conducting element 24 comprises a Li-Ion battery with a metal housing.

Figure 3:
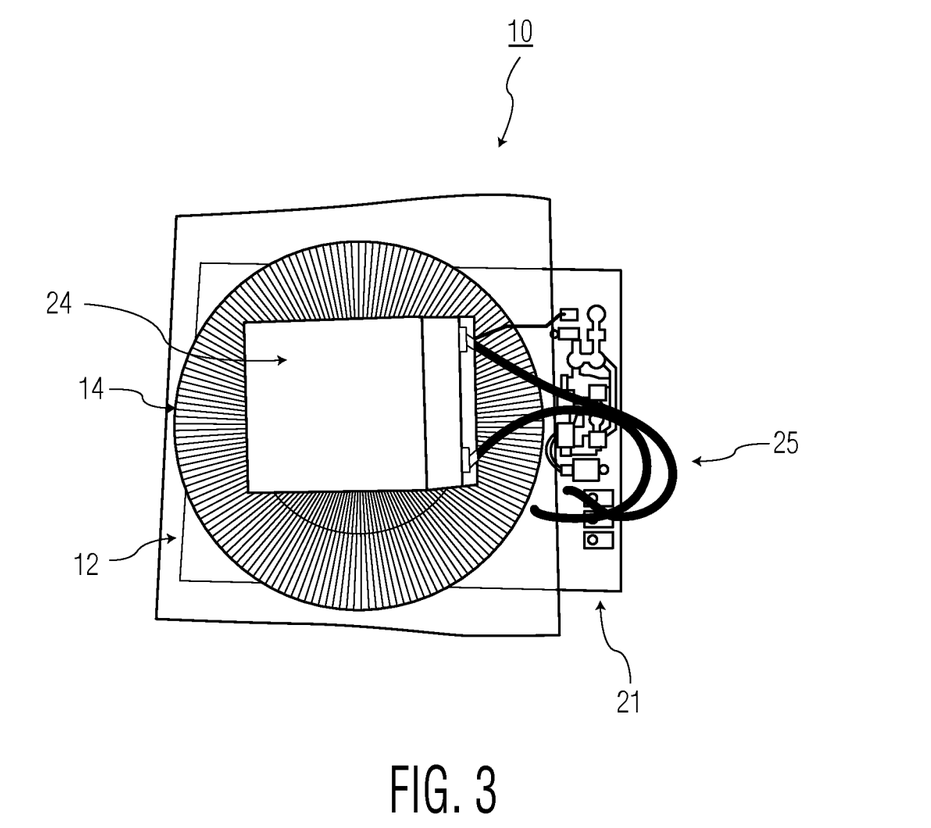
FIG. 3 is a top-down view of the several components of the electronic device having an inductive receiver coil with ultra-thin shielding layer of FIG. 2 in a stacked arrangement according to an embodiment of the present disclosure.

FIG. 3 is a top-down view of the components of FIG. 2 in a stacked arrangement according to an embodiment of the present disclosure. In particular, FIG. 3 illustrates receiver coil 12 with its associated spiral conductor 20 (FIG. 2), shielding layer 14 with eddy current dissipation features 22 (FIG. 1), and conducting element 24. In addition, conducting element 24 comprises a battery that is electrically coupled to electronics 21 of power receiver 12 via suitable electrical conductors, generally indicated by reference numerals 25. Furthermore, FIG. 3 shows one example of an assembled receiver. With the assembled receiver, a good power transfer with only slightly increased losses could be demonstrated, while without shielding, or with a shielding without slits, the losses were remarkable.

Figure 4:
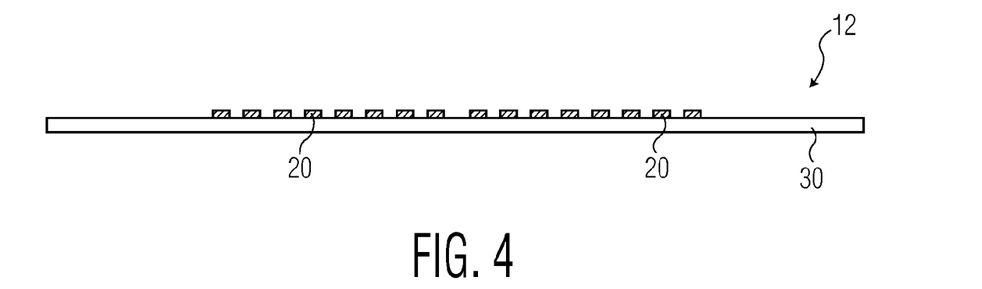
FIGS. 4-8 are cross-sectional views of a portion of the electronic device having an inductive receiver coil with ultra-thin shielding layer during various stages of manufacture according to an embodiment of the present disclosure.

FIGS. 4-8 are cross-sectional views of a portion of the electronic device 10 (FIGS. 1 and 3) having an inductive receiver coil 12 with ultra-thin shielding layer 14 during various stages of manufacture according to an embodiment of the present disclosure. Referring now to FIG. 4, a cross-sectional view of inductive receiver coil 12 is shown and which is formed of a flexible substrate 30, preferably having a thickness on the order of 100 μm or less. Substrate 30 comprises, for example, polyimide foil (also referred to as "Flexfoil"). A laterally disposed coil of conductive material 20 of a given number of turns is formed upon a surface of the flexible substrate 30, including appropriate interconnects (not shown) for electrical connection to the additional electronics discussed herein. For example, the coil of conductive material 20 can comprise a spiral winding of copper conductors. As illustrated in the Figures, in one embodiment, coil 22 includes a single layer of conductive material. In other embodiments, coil 22 can include two or more layers of conductive material, wherein adjacent layers are separated by a suitable insulative substrate or material. The specifications or properties of the coil 20 are determined according to the specific requirements of a given electronic device 10. In one embodiment, the coil properties can include those as specified in the Table below.

TABLE

Properties of the coil in one embodiment

Dimensions

| Coil diameter/mm | d_out | 36 |
| --- | --- | --- |
| Outer coil radius/mm | r_out | 18 |
| Inner coil radius/mm | r_in | 0.2 |
| Number of turns per layer | N_tpl | 15 |
| Number of layers | N_lay | 2 |
| Track width/mm | w_t | 1 |
| Track distance/mm | d_t | 0.2 |
| Copper thickness/um | t | 35 |
| Layer distance/um | h | 100 |

Measured parameters

| DC inductivity*/H | L_dc | 13.5E−6 |
| --- | --- | --- |
| DC resistance*/Ohm | R_dc | 0.93 |
| AC inductivity*/H | L_ac | 13.2E−6 |
| AC resistance*/Ohm | R_ac | 2.7 |
| AC Quality factor* | Q | 15.8 |
| Self resonance/Hz | fres | 3.8E+6 |
| Parasitic capacitance/F | Cp | 132.9E−12 |

*DC measured at 10 kHz
AC measured at 500 kHz

Figure 5:
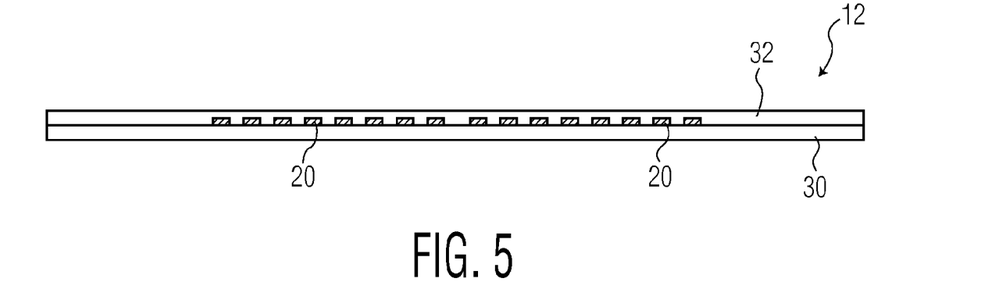
Figure 6:
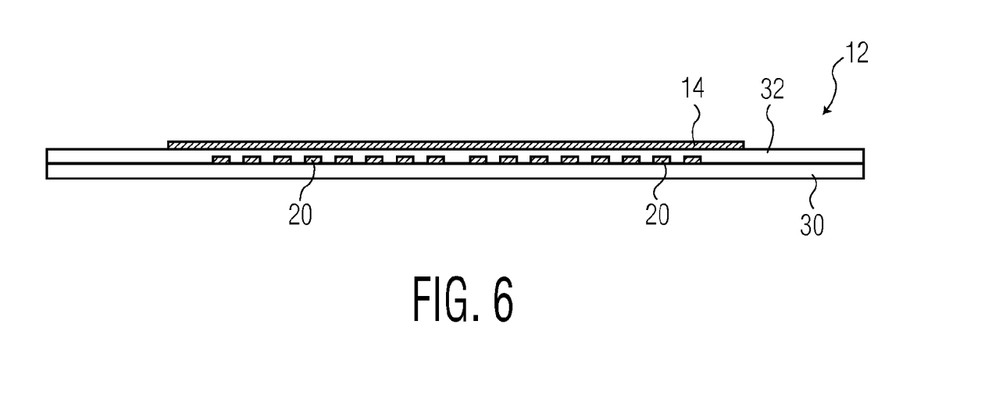

Referring now to FIG. 5, an adhesive insulation layer 32 having a substantially planar top surface is formed overlying substrate 30 and conductive coil 20. The layer 32 can comprise any suitable layer for providing adhesion and insulation as needed in the formation of the electronic device 10. Subsequent to the formation of layer 32, as illustrated in FIG. 6, a structured high permeable metal sheet 14 fabricated according to the requirements of the shielding layer for the electronic device 10 is laminated to the top surface of the adhesive insulation layer 32. Accordingly, a flexible substrate 30 with integrated coil winding 20 is coupled to flexible magnetic high permeable shielding layer 14, further as discussed herein.

In one embodiment, the shielding layer 14 comprises an ultra-thin softmagnetic metal foil of Mumetal, having a thickness which is more than an order of magnitude thinner than the prior known receiver coil shielding layers. Because of the extremely high magnetic permeability of Mumetal on the order of $\mu_r > 10000$ and a high saturation flux, a thickness on the order of 50 μm or less is sufficient for the shielding layer. In addition, this kind of material is electrically conducting. Therefore, eddy currents can be induced in the shielding material which causes undesired losses. The losses reduce the power transfer and generate heat, which might even be dangerous, e.g. for a battery of a portable electronic device. To be able to use the ultra-thin softmagnetic metal foil for magnetic shielding, the unwanted eddy currents in the shielding layer are advantageously suppressed by providing radial slits in the shielding layer, as discussed further herein. In general, the slits should be arranged orthogonal to the current traces of coil 20 of the receiver 12. In one embodiment, the thickness of shielding layer 14 is in the range of 25 μm to 100 μm.

Figure 7:
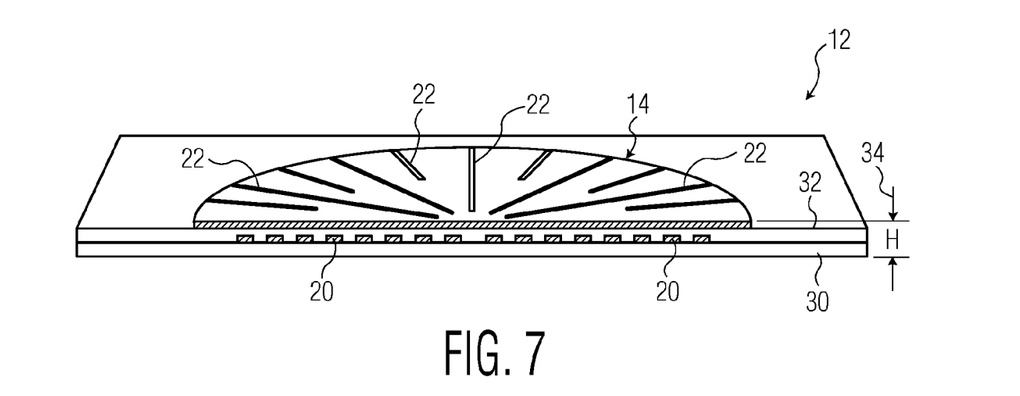

Referring now to FIG. 7, a perspective cross-sectional view of the inductive receiver coil 12 with the shielding layer 14 is illustrated according to one embodiment of the present disclosure. Shielding layer 14 includes one or more eddy current suppression or mitigation features, as designated by reference numeral 22. In one embodiment, the eddy current suppression or mitigation features comprise radial slits formed within the shielding layer, as discussed further herein below. A height parameter H, generally designated by reference numeral 34, represents a total thickness of the receiver coil 12 and shielding layer 14. According to the embodiments of the present disclosure, the height H is on the order of less than 300 μm, more particularly on the order of less than 200 μm, and preferably on the order of between 75 to 150 μm.

Figure 8:
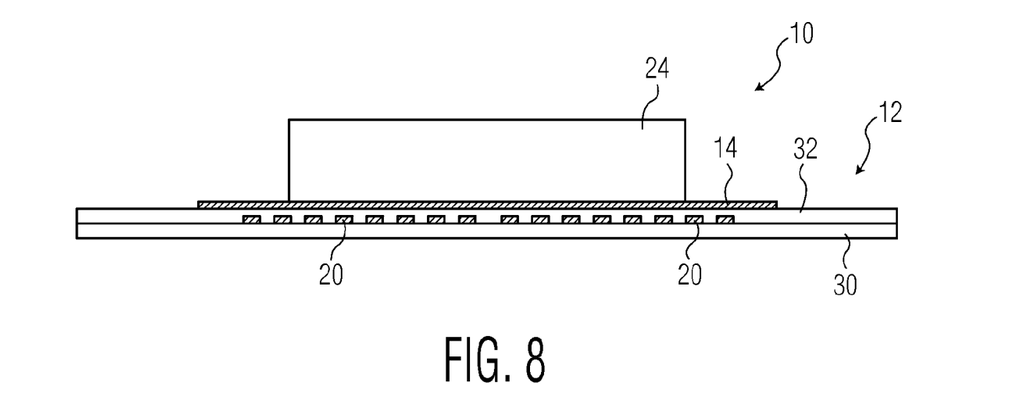

For further understanding, in operation, the softmagnetic shielding layer 14 that is placed on top of the receiver coil 12 advantageously guides magnetic flux of the receiver coil through the material of the shielding layer such that the magnetic flux does not penetrate a metal object 24 on top of the shielding layer 14, as illustrated in FIG. 8. The magnetic flux lines are directed in radial direction in relation to the receiver coil, and in relation to the shielding material above the receiver coil.

In the shielding layer by itself without suppression or mitigation features, eddy currents can be induced in the presence of magnetic flux. That is, flexible materials with extreme high permeability are typically electrically conducting. For an electrically conducting layer in the presence of magnetic flux, eddy currents flow perpendicular to the magnetic flux lines. Thus, for the shielding layer alone, the eddy currents could cause undesired losses reducing the power transfer and generating heat, which might even be dangerous, e.g. for a battery of the mobile electronic device.

To avoid the unwanted eddy currents in the shielding layer 14, the shielding layer is provided with eddy current suppression or mitigation features 22. In one embodiment, the eddy current suppression features 22 comprise radial slits. The radial slits are arranged perpendicular to the original eddy currents that would exist in the absence of the radial slits, and thus impose a large impedance to eddy currents. In this manner, eddy currents are strongly reduced, as well as any related losses. In addition, the radial slits 22 are arranged in parallel to the magnetic flux lines, such that the magnetic flux is not adversely influenced. As a result, the eddy current suppression slit features 22 do not degrade the magnetic shielding properties of the ultra-thin softmagnetic shielding layer 14.

An advantageous effect of the eddy current suppression or mitigation features 22 within the ultra-thin softmagnetic shielding layer 14 is that (i) magnetic fields remain shielded (that is, the shielding layer is not made transparent to magnetic fields) and (ii) disadvantageous losses and an impact of eddy currents on the inductivity of the receiver coil 12 are significantly reduced. This astonishing effect of the embodiments of the present disclosure is based on the insight that the softmagnetic material shielding layer retains its ability to guide the magnetic flux, because the slits are arranged in parallel to the flux lines. The suppressed eddy currents' contribution to the magnetic shielding effect is only minor. In contrast, a prior known structure having slits in a metal housing makes the housing transparent to magnetic fields, wherein the shielding effect of the metal housing is only produced in response to (i.e., caused by) the eddy currents which generate a compensating field. In such a prior known structure, it would not be desirable to suppress the eddy currents, because suppressing the eddy currents in that situation would remove the shielding function, thus destroying its intended purpose.

As introduced herein above, the shielding foil or shielding layer 14 of the electronic device 10 with radial slits 22 can be manufactured by laser cutting. In an initial step, a transparent adhesive foil (e.g. tesafilm) can be attached to a backside of a piece of Mumetal. The Mumetal with the backing of transparent adhesive foil is then laser cut from the top surface. With laser cutting, the Mumetal absorbs most of the energy of the laser, becomes molten, and evaporates. In this manner, desired radial slits are "cut" into the metal foil. As soon as the laser beam can penetrate the metal foil, it is no longer absorbed, because the transparent foil on the back side does not absorb the laser beam, but lets it pass. As a result, the transparent adhesive foil is not damaged and remains in one piece. Accordingly, arbitrary shapes of the shielding metal foil can be cut out, even if there are no material bridges to remain between single pieces of shielding material. As a final step, any unneeded metal pieces are pealed off of the adhesive foil and the remaining metal structure is glued onto the substrate or receiver coil, with the transparent adhesive foil on top. In addition, if needed, the transparent adhesive foil can now be detached or removed via suitable methods. Still further, yet another method to manufacture the shielded receiver 12 is to laminate the shielding layer 14 on top of the coil 20 and then etch the desired resultant structure.

As discussed herein, the shielding layer 14 comprises a thin layer, wherein due to small thickness of the shielding foil, the shielding layer is flexible and bendable. The receiver coil can also be manufactured on a flexible substrate. Accordingly, the entire receiver 12 with shielding layer 14 can be made bendable. An additional advantage is that the receiver and shielding layer can fit readily to a curved shape of a housing of an electronic device, thereby enabling a higher degree of design freedom. Furthermore, the width of the slits in the shielding layer can be made as narrow as desired. The slits can also be filled with non-conducting material. The number of slits formed within the shielding layer can be determined according to the particular requirements of a given electronic device implementation. For example, a single long diagonal slit should provide a positive effect, whereas, a greater number of slits would likely assist in a corresponding reduction in additional losses.

Figure 9:
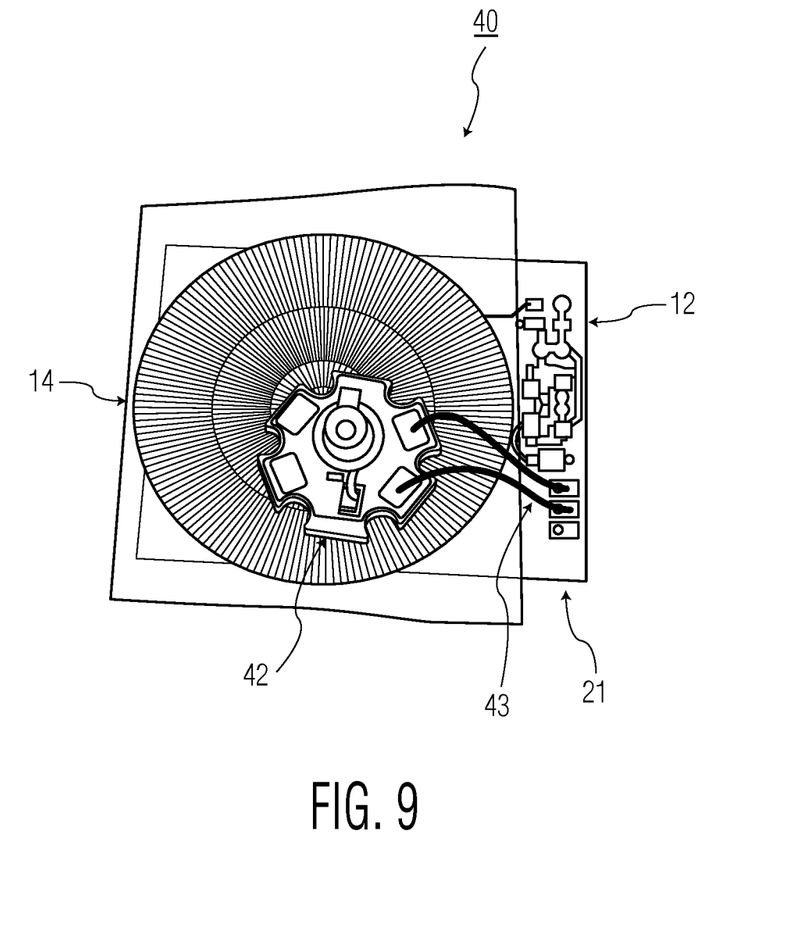
FIG. 9 is a top-down view of the several components of an electronic device having an inductive receiver coil with ultra-thin shielding layer in a stacked arrangement according to another embodiment of the present disclosure.

FIG. 9 is a top-down view of the several components of an electronic device 40 having an inductive receiver coil 12 with ultra-thin shielding layer 14 in a stacked arrangement according to another embodiment of the present disclosure. As a different application example, the embodiment of FIG. 9 includes a high power LED 42 with a metallic base plate as the conductive or metallic object on top of the shielding layer 14. The conductive or metallic object could also comprise a larger type of lamp or a heat sink.

Accordingly, there has thus been described herein an electronic device configured for being inductively powered or charged comprising: an inductive receiver coil configured for generating current in response to being exposed to an alternating magnetic field generated substantially on a first side of the receiver coil, and a softmagnetic shielding layer disposed on a second side of the receiver coil, opposite to the first side where the magnetic field is generated, configured (i) to shield the magnetic field from an overlying object wherein the overlying object is (i)(a) subject to being undesirably influenced by the magnetic field, or (i)(b) subject to causing an undesirable influence on the magnetic field and (ii) to mitigate formation of eddy currents within the softmagnetic shielding layer and the overlying object. In one embodiment, the softmagnetic shielding layer includes an ultra-thin layer having a thickness less than or equal to one hundred micrometers (100 µm).

According to another embodiment, the softmagnetic shielding layer includes at least one eddy current mitigation feature that comprises a number of slits formed within the softmagnetic shielding layer, wherein the slits are substantially parallel to magnetic flux lines and orthogonal to eddy current flow for imposing a large impedance to eddy current formation. In one embodiment, the slits formed within the softmagnetic shielding layer are created via laser cutting, wherein a layer of softmagnetic shielding material is attached to a transparent adhesive foil, laser energy is directed towards the softmagnetic shielding material layer at desired sites to evaporate corresponding softmagnetic shielding material to form the slits, wherein the transparent adhesive foil remains intact. In another embodiment, a layer of softmagnetic shielding material is laminated to one selected from the group consisting of the inductive receiver coil and a printed circuit board, further wherein the layer of material is etched to form the softmagnetic shielding layer with slits.

According to further embodiments, a total thickness of the inductive receiver coil and the softmagnetic shielding layer is on the order of less than 300 µm. In addition, the softmagnetic shielding layer comprises a material selected from the group consisting of Mumetal, nanocristaline metal and amorphous metals. In the later instance, the softmagnetic shielding layer has a thickness on the order of fifty micrometers or less.

In yet another embodiment, the softmagnetic shielding layer comprises a shape of sufficient size to cover the receiver coil on a single side of the receiver coil. In a further embodiment, the inductive receiver coil comprises a circular shaped coil and further wherein the softmagnetic shielding layer includes eddy current mitigation features that comprise slits that emanate in a radial direction from a location centred on the circular shaped receiver coil. In a still further embodiment, the inductive receiver coil comprises a flexible substrate having a coil of conductive material integrated within the flexible substrate, and wherein the softmagnetic shielding layer comprises a flexible layer.

In yet another embodiment, the overlying object comprises one selected from the group consisting of a rechargeable battery with a conductive housing and an electronic circuit. In still another embodiment, the conductive object comprises a lamp with a metallic base plate, further wherein the metallic base plate of the lamp is configured for being disposed overlying the shielding layer, the lamp for being powered in response to the generated current.

In another embodiment, an electronic device configured for being inductively powered or charged, comprises: an inductive receiver coil configured for generating current in response to being exposed to an alternating magnetic field generated substantially on a first side of the inductive receiver coil; and an ultra-thin softmagnetic shielding layer disposed on a second side of the inductive receiver coil, opposite to the first side where the magnetic field is generated, configured (i) to shield the magnetic field from an overlying object wherein the overlying object is (i)(a) subject to being undesirably influenced by the magnetic field, or (i)(b) subject to causing an undesirable influence on the magnetic field and (ii) to mitigate formation of eddy currents within the shielding layer and the overlying object, wherein the shielding layer comprises a thickness less than or equal to one hundred micrometers (100 µm), wherein said shielding layer includes at least one eddy current mitigation feature that comprises a number of slits formed within the shielding layer, wherein the slits are substantially parallel to magnetic flux lines and orthogonal to eddy current flow for imposing a large impedance to eddy current formation, and wherein the shielding layer comprises a material selected from the group consisting of Mumetal, nanocristaline metal and amorphous metals.

In a further embodiment, the conductive object comprises one selected from the group consisting of (i) a rechargeable battery with a conductive housing, (ii) an electronic circuit and (iii) a lamp module with a metallic base plate, further wherein the metallic base plate of the lamp module is configured for being disposed overlying the shielding layer, the lamp for being powered in response to the generated current. In one embodiment, the lamp module comprises a high power LED module.

According to another embodiment of the present disclosure, a method for configuring an electronic device for being inductively powered or charged, comprises: configuring an inductive receiver coil for generating current in response to being exposed to an alternating magnetic field generated substantially on a first side of the inductive receiver coil; and disposing an ultra-thin softmagnetic shielding layer on a second side of the inductive receiver coil, opposite to the first side where the magnetic field is generated, configured (i) to shield the magnetic field from an overlying object wherein the overlying object is (i)(a) subject to being undesirably influenced by the magnetic field, or (i)(b) subject to causing an undesirable influence on the magnetic field and (ii) to mitigate formation of eddy currents within the shielding layer and the overlying object, wherein the shielding layer comprises a thickness less than or equal to one hundred micrometers (100 µm).

In another embodiment of the method, disposing said shielding layer includes providing at least one eddy current mitigation feature that comprises a number of slits formed within the shielding layer, wherein the slits are substantially parallel to magnetic flux lines and orthogonal to eddy current flow for imposing a large impedance to eddy current formation. In yet another embodiment, the slits formed within the softmagnetic shielding layer are created via laser cutting, wherein a layer of softmagnetic shielding material is attached to a transparent adhesive foil, laser energy is directed towards the softmagnetic shielding material layer at desired sites to evaporate corresponding softmagnetic shielding material to form the slits, wherein the transparent adhesive foil remains intact.

In a still further embodiment of the method, a total thickness of the inductive receiver coil and the ultra-thin softmagnetic shielding layer is on the order of less than 300 µm, and wherein the ultra-thin softmagnetic shielding layer comprises a material selected from the group consisting of Mumetal, nanocristaline metal and amorphous metals. Yet still further, the overlying object comprises one selected from the group consisting of (i) a rechargeable battery with a conductive housing, (ii) an electronic circuit and (iii) a lamp module with a metallic base plate, further wherein the metallic base plate of the lamp module is configured for being disposed overlying the shielding layer, the lamp module for being powered in response to the generated current. In one embodiment, the lamp module comprises a high power LED module.

Although only a few exemplary embodiments have been described in detail above, those skilled in the art will readily appreciate that many modifications are possible in the exemplary embodiments without materially departing from the novel teachings and advantages of the embodiments of the present disclosure. For example, the embodiments of the present disclosure can be applied to electronic devices featuring data communication based upon magnetic fields, which becomes possible with the embodiments of the present disclosure. For instance, the slits allow for detection of a radio frequency identification (RFID) tag located inside the housing (16,18) of the electronic device 10. In addition, near field communication (NFC) also becomes possible. Still further, the softmagnetic shielding layer 14 could be used for detection of the mobile device on an inductive transmitter. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

In addition, any reference signs placed in parentheses in one or more claims shall not be construed as limiting the claims. The word "comprising" and "comprises," and the like, does not exclude the presence of elements or steps other than those listed in any claim or the specification as a whole. The singular reference of an element does not exclude the plural references of such elements and vice-versa. One or more of the embodiments may be implemented by means of hardware comprising several distinct elements, and/or by means of a suitably programmed computer. In a device claim enumerating several means, several of these means may be embodied by one and the same item of hardware. The mere fact that certain measures are recited in mutually different dependent claims does not indicate that a combination of these measures cannot be used to an advantage.

The invention claimed is:

1. A method for configuring an electronic device for being inductively powered or charged, comprising:
configuring an inductive receiver coil for generating current in response to being exposed to an alternating magnetic field generated substantially on a first side of the inductive receiver coil; and
disposing an ultra-thin soft magnetic shielding layer, comprising a thickness less than or equal to one hundred micrometers (100 μm), on a second side of the inductive receiver coil, opposite to the first side where the magnetic field is generated, the soft magnetic shielding layer configured to mitigate formation of eddy currents within the shielding layer and an overlying object wherein forming within the soft magnetic shielding layer, via laser cutting, a plurality of slits substantially parallel to magnetic flux lines and orthogonal to eddy current flow, wherein the soft magnetic shielding material is attached to a transparent adhesive foil, and laser energy is directed towards the soft magnetic shielding material layer at desired sites to evaporate corresponding soft magnetic shielding material to form the slits, wherein the transparent adhesive foil remains intact, said slits configured to impose a large impedance to eddy current formation extending from an outer perimeter of the shielding layer toward a middle region of the shielding layer, wherein the middle region comprises:
a material selected from a group consisting of: Mumetal, nanocristaline metal and amorphous metals and the slits are not present in the middle region.

2. The method of claim 1, wherein a total thickness of the inductive receiver coil and the ultra-thin soft magnetic shielding layer is than 300 μm.

3. The method of claim 1, wherein the overlying object comprises an object selected from a group consisting of: a rechargeable battery with a conductive housing, an electronic circuit and a lamp module with a metallic base plate, further wherein the metallic base plate of the lamp module is configured for being disposed overlying the shielding layer, the lamp for being powered in response to the generated current.

* * * * *